(12) United States Patent
Morita et al.

(10) Patent No.: US 8,152,049 B2
(45) Date of Patent: Apr. 10, 2012

(54) ELECTRONIC COMPONENT MOUNTING APPARATUS AND ELECTRONIC COMPONENT MOUNTING METHOD

(75) Inventors: Takeshi Morita, Fukuoka (JP); Masanori Hiyoshi, Fukuoka (JP)

(73) Assignee: Panasonic Corporation, Osaka (JP)

( * ) Notice: Subject to any disclaimer, the term of this patent is extended or adjusted under 35 U.S.C. 154(b) by 248 days.

(21) Appl. No.: 12/439,282

(22) PCT Filed: Aug. 23, 2007

(86) PCT No.: PCT/JP2007/066364
§ 371 (c)(1),
(2), (4) Date: Apr. 1, 2009

(87) PCT Pub. No.: WO2008/026504
PCT Pub. Date: Mar. 6, 2008

(65) Prior Publication Data
US 2009/0321499 A1    Dec. 31, 2009

(30) Foreign Application Priority Data

Sep. 1, 2006    (JP) .............................. P. 2006-237245

(51) Int. Cl.
*B23K 35/12* (2006.01)
*B23K 1/00* (2006.01)
(52) U.S. Cl. ........................ 228/249; 228/245; 228/41
(58) Field of Classification Search ........... 228/245–255
See application file for complete search history.

(56) References Cited

FOREIGN PATENT DOCUMENTS

| | | | |
|---|---|---|---|
| JP | 63-258033 A | 10/1988 | |
| JP | 09-024665 | * | 1/1997 |
| JP | 2000-022394 A | 1/2000 | |
| JP | 2002-185117 A | 6/2002 | |
| JP | 2003-298292 A | 10/2003 | |

OTHER PUBLICATIONS

Machine Tranlsation of JP 2003-298292 from JPO website.*
International Search Report.

* cited by examiner

*Primary Examiner* — David Sample
*Assistant Examiner* — Megha Mehta
(74) *Attorney, Agent, or Firm* — Pearne & Gordon LLP

(57) ABSTRACT

The present invention aims at providing an electronic component mounting apparatus and an electronic component mounting method that perform automated setting of a thickness of a paste film.

The electronic component mounting apparatus of the present invention has a paste transfer unit 10 that horizontally, relatively moves a squeegee 11b and a transfer surface 13 with respect to each other, thereby spreading, over the transfer surface 13, a paste film 3 whose thickness is equivalent to the height of a squeegee gap "c" formed from clearance between the squeegee 11b and the transfer surface 13; a storage unit 18 that stores a database defining correlation among bump heights, paste types, and squeegee-gap heights; a computing unit 20 that derives, from the database, a squeegee-gap height $G_{21}$ in correspondence with a height $H_1$ of a bump of an electronic component to be mounted and a type $P_2$ of paste to be transferred; and a vertical movement mechanism 16b that adjusts the height of the squeegee gap "c" formed from clearance between the squeegee 11b and the transfer surface 13 to a derived squeegee-gap height.

4 Claims, 5 Drawing Sheets

# ELECTRONIC COMPONENT MOUNTING APPARATUS AND ELECTRONIC COMPONENT MOUNTING METHOD

TECHNICAL FIELD

The present invention relates to an electronic component mounting apparatus and an electronic component mounting method for mounting on a substrate electronic components whose bumps have transferred paste.

BACKGROUND ART

In a field of mounting electronic components on a substrate, there has widely been used a technique for electrically, physically connecting an electronic component on a substrate by connecting a bump provided on the electronic component to an electrode laid on a substrate. Since paste containing flux or solder as an ingredient is used for connecting bumps to electrodes, paste is previously supplied to yet-to-be-connected bumps. A transfer method is frequently used for supplying paste to a bump, and paste is transferred to a bump by immersing a yet-to-be-connected bump in paste spread to a predetermined thickness on a transfer surface (see Patent Document 1).

Patent Document 1: JP-A-2000-22394

DISCLOSURE OF THE INVENTION

Problem that the Invention is to Solve

Incidentally, when the amount of paste to be transferred to a bump is excessively larger than an appropriate amount, a bridge failure, which would otherwise be caused as a result of adjacent bumps being soldered together during reflow soldering operation, becomes likely to arise. In contrast, the amount of paste is excessively smaller than the appropriate amount, an open failure, which would otherwise be caused as a result of an electronic component being not properly connected to a substrate, becomes likely to arise. Electronic components to be mounted on a substrate include varieties of components having different sizes and shapes and differ from each other in terms of the height of a bump. Paste also includes varieties of paste, such as PbSn solder paste and SnAgCu solder paste, and they have different properties. Accordingly, in order to keep connection quality constant, the thickness of a paste film must be set such that the amount of paste to be transferred to a bump becomes appropriate without regard to the nature of an electronic component to be mounted and the nature of paste to be transferred.

However, since the thickness of a paste film has hitherto been set in accordance with the experience and intuition of an operator, the degree of skill often decides the thickness. Differences among individual operators sometimes lead to variations in connection quality. Moreover, reliance on personal elements, such as experience and intuition, affords large room for occurrence of careless mistakes, such as preconception and misapprehension, and results in unfavorable quality control.

Accordingly, the present invention aims at providing an electronic component mounting apparatus and an electronic component mounting method that perform automated setting of a thickness of a paste film.

Means for Solving the Problem

First aspect of the invention provides an electronic component mounting apparatus that mounts on a substrate an electronic component having a bump to which paste spread over a transfer surface is transferred, the apparatus comprising a paste transfer unit that horizontally, relatively moves a squeegee and the transfer surface with respect to each other, thereby spreading, over the transfer surface, a paste film whose thickness is equivalent to a height of a squeegee gap formed from clearance between the squeegee and the transfer surface; a storage unit that stores a database defining correlation among bump heights, paste types, and squeegee-gap heights; a squeegee gap height delivering unit that derives, from the database, a squeegee-gap height in correspondence with a height of a bump of an electronic component to be mounted and a type of paste to be transferred; and a squeegee-gap height adjustment unit that adjusts the height of the squeegee gap formed from clearance between the squeegee and the transfer surface to a derived squeegee-gap height.

Second aspect of the invention further comprises a vertical movement unit that vertically moves the squeegee and the transfer surface with respect to each other.

Third aspect of the invention is characterized in that the transfer surface is partitioned into a plurality of surfaces of different heights.

Fourth aspect of the invention provides an electronic component mounting method for mounting on a substrate an electronic component having a bump to which paste spread over a transfer surface is transferred by means of a squeegee, the method comprising a step of deriving a squeegee-gap height in correspondence with a height of a bump of an electronic component to be mounted and a type of paste to be transferred from a database defining correlation among bump heights, paste types, and squeegee-gap heights; a step of adjusting to a derived squeegee-gap height a squeegee gap formed from clearance between a squeegee and the transfer surface; a step of spreading, over the transfer surface, paste to a thickness equivalent to a height of a squeegee gap formed from clearance between the squeegee and the transfer surface by means of horizontally, relatively moving the squeegee and the transfer surface with respect to each other; and a step of transferring the paste spread over the transfer surface to the bump and mounting the electronic component to the substrate.

Advantage of the Invention

Correlation among bump heights, paste types, and squeegee-gap heights is defined as a database, and the height of a squeegee gap is automatically derived in response to the height of a bump of an electronic component to be mounted and the type of paste to be transferred. Accordingly, an appropriate, exact amount of paste can be transferred to a bump, so that given connection quality can be assured.

Figure 1:
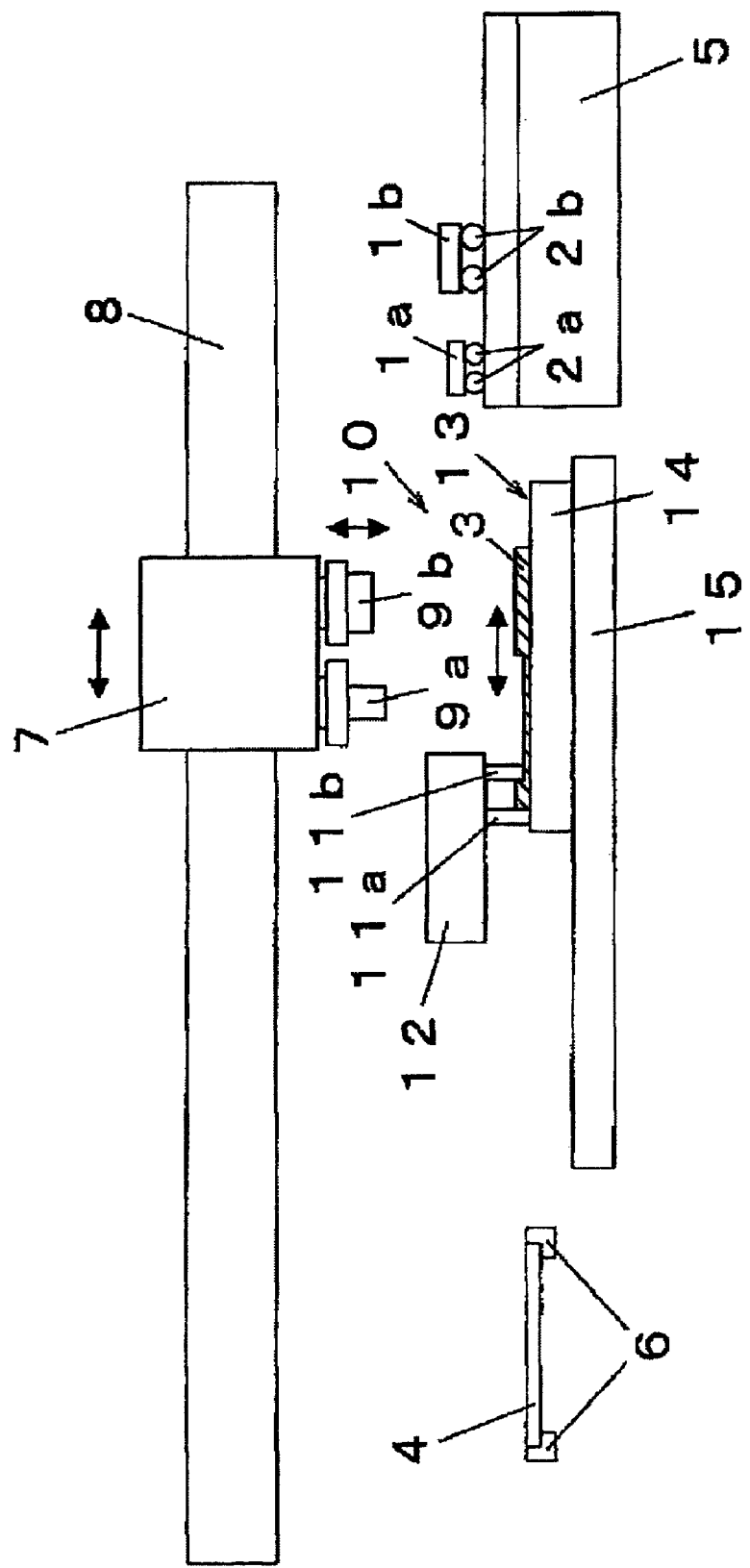
FIG. 1 is a side view of an electronic component mounting apparatus of an embodiment of the present invention.

DESCRIPTIONS OF THE REFERENCE NUMERALS 1a, 1b ELECTRONIC COMPONENTS
2a, 2b BUMPS
3 PASTE FILM
4 SUBSTRATE
10 PASTE TRANSFER UNIT
11b SQUEEGEE
13 TRANSFER SURFACE
15 HORIZONTAL MOVEMENT MECHANISM
16b VERTICAL MOVEMENT MECHANISM
18 STORAGE UNIT
20 COMPUTING UNIT
C SQUEEGEE GAP

BEST MODE FOR IMPLEMENTING THE INVENTION

Figure 2:
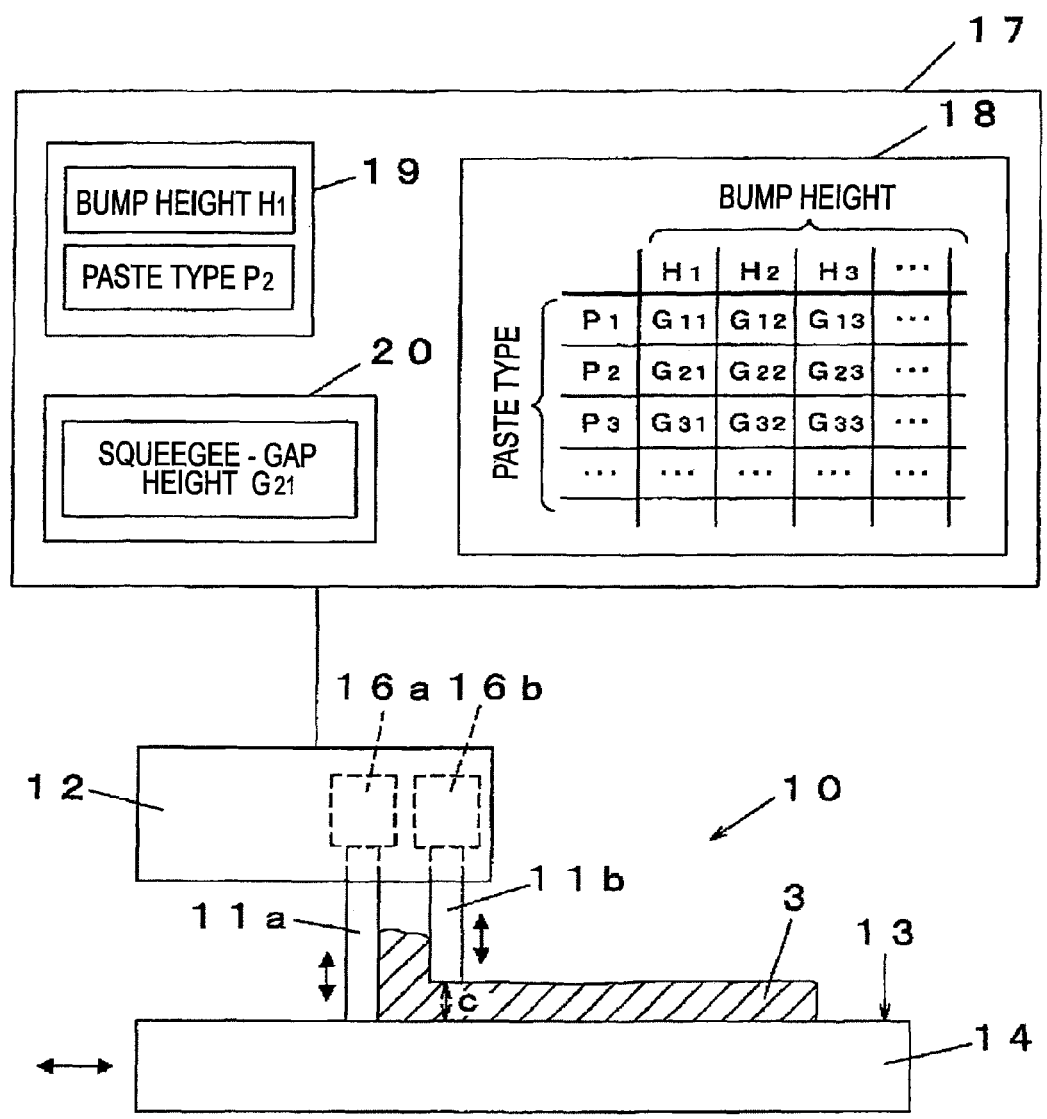
FIG. 2 is a block diagram including a control system of a paste transfer unit of the embodiment of the present invention.
Figure 3A:
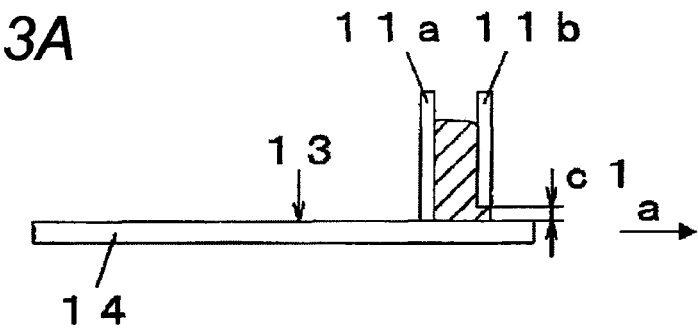
FIGS. 3A to 3D are views for describing paste spreading operation of a paste transfer unit of the embodiment of the present invention.
Figure 3B:
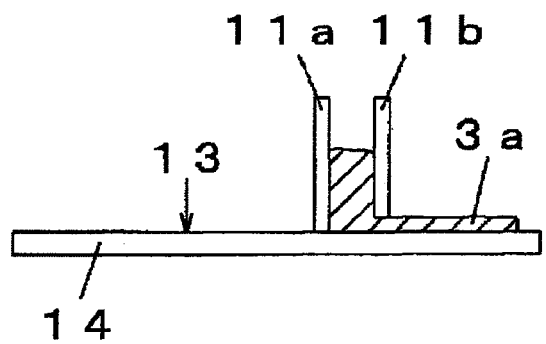
Figure 3C:
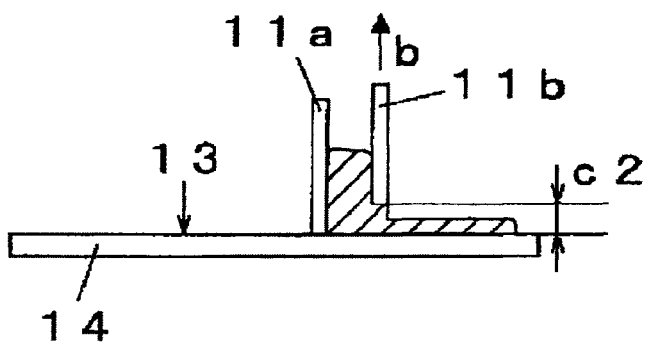
Figure 3D:
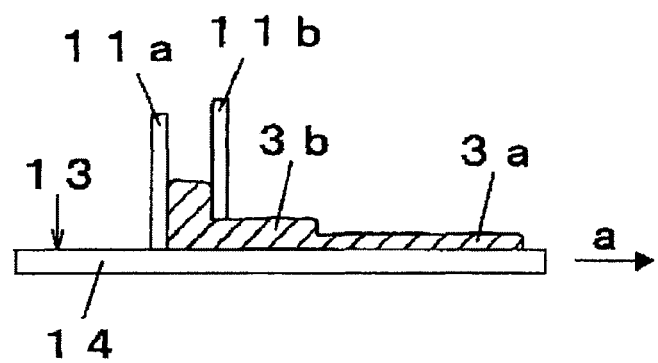
Figure 4A:
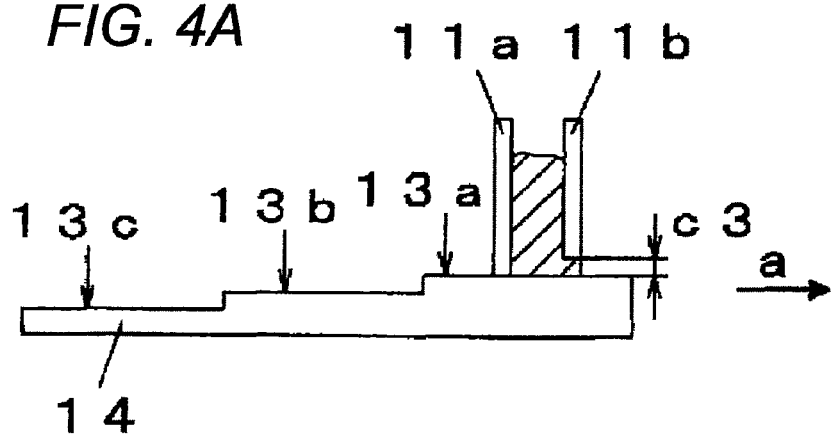
FIGS. 4A and 4b are views for describing paste spreading operation of the paste transfer unit of another embodiment of the present invention.
Figure 4B:
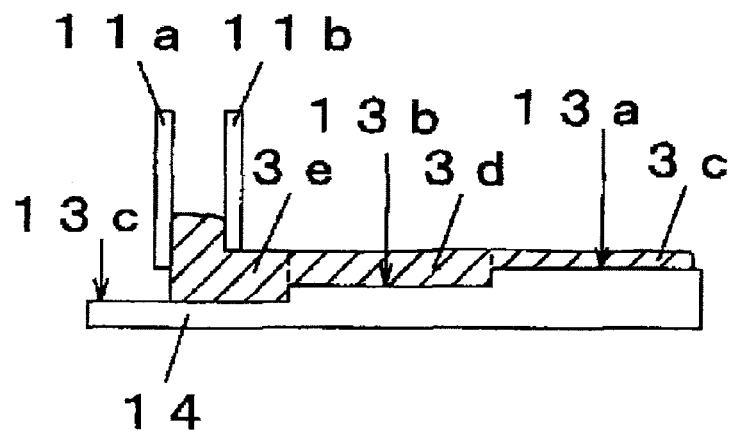
Figure 5:
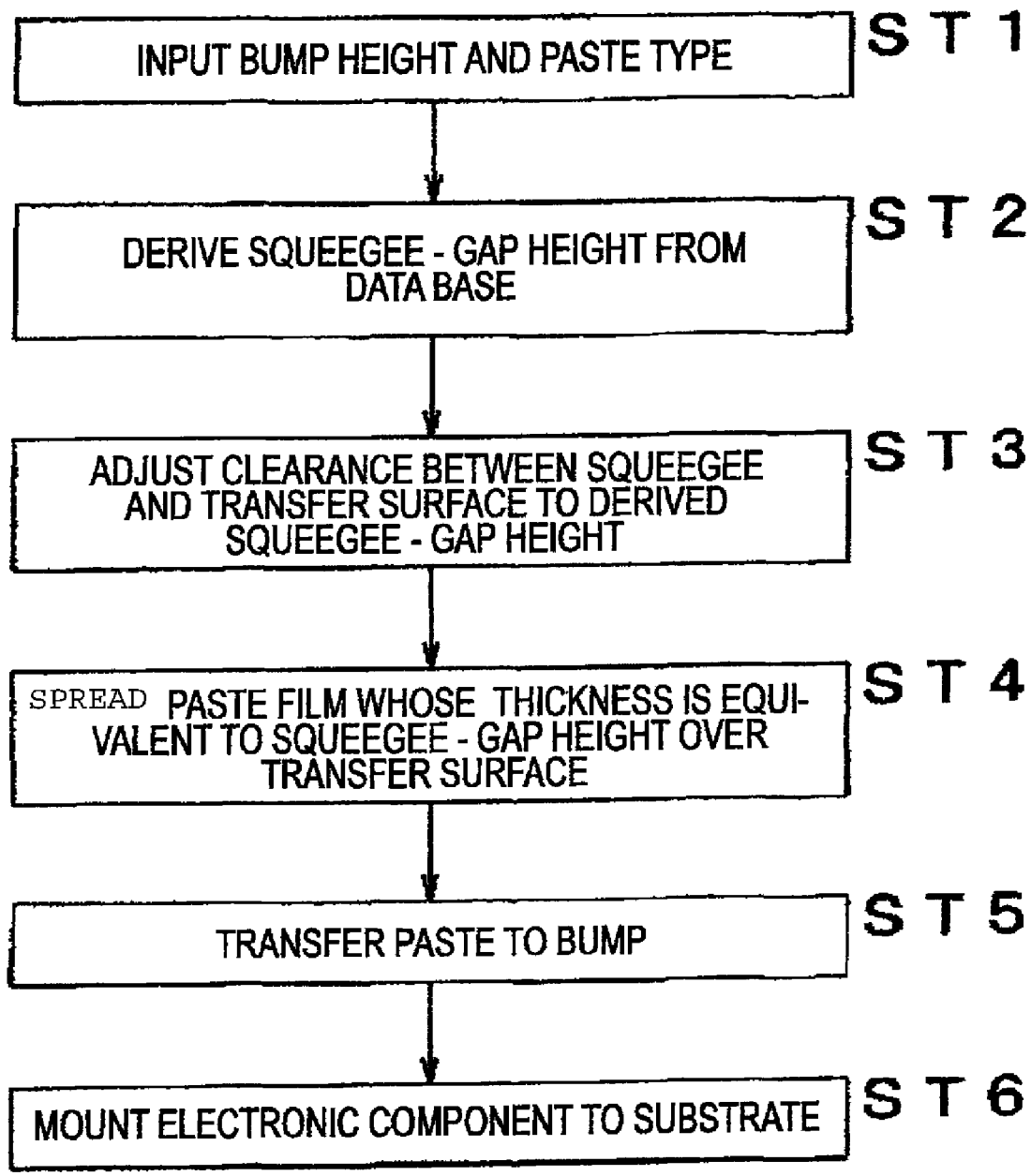
FIG. 5 is a flowchart showing a mounting process of the electronic component mounting apparatus of the embodiment of the present invention.

An embodiment of the present invention will be described by reference to FIGS. 1 through 5. FIG. 1 is a side view of an electronic component mounting apparatus of an embodiment of the present invention; FIG. 2 is a block diagram including a control system of a paste transfer unit of the embodiment of the present invention; FIGS. 3A to 3D are views for describing paste spreading operation of a paste transfer unit of the embodiment of the present invention; FIGS. 4A and 4B are views for describing paste spreading operation of the paste transfer unit of another embodiment of the present invention; and FIG. 5 is a flowchart showing a mounting process of the electronic component mounting apparatus of the embodiment of the present invention.

First, the electronic component mounting apparatus of the embodiment of the present invention is described by reference to FIGS. 1 and 2. In FIG. 1, the electronic component mounting apparatus has a function of transferring a paste film 3 to bumps 2 formed on electronic components 1, such as semiconductor packages, and mounting the electronic components on a substrate 4. The electronic components 1 are housed in a component supply unit 5 with their bumps 2 down. Varieties of electronic components having different bump heights are prepared for the electronic components 1. An electronic component 1a having bumps 2a of comparatively small ball size and an electronic component 1b having bumps 2b of comparatively large ball size are illustrated. The substrate 4 is held at a predetermined position with its both ends supported by guide rails 6. The substrate 4 can move along the guide rails 6. When the substrate 4 having undergone mounting is carried out of the electronic component mounting apparatus along the guide rails 6, a substrate, which is not yet subjected to mounting, is carried into the electronic component mounting apparatus along the guide rails 6 and held at a predetermined position. An upper surface of the substrate 4 serves as a mount surface, and a plurality of pads (not shown) are formed on the mount surface. The pads are taken as electrode terminals for the substrate 4; the bumps 2 are taken as electrode terminals for the electronic component 1; and both electrode terminals are electrically, mechanically connected together. A transfer head 7 has a function of moving the electronic component 1 housed in a component supply unit 5 to the substrate 4. The transfer head 7 is configured so as to be freely movable in a horizontal direction above the component supply unit 5 and the substrate 4 by an orthogonal movement mechanism 8. The transfer head 7 is equipped with a nozzle 9 that is freely movable in the vertical direction, and the nozzle 9 picks up the electronic component 1 by suction and mounts the thus-picked-up electronic component 1 on the substrate 4. The nozzle 9 is used while replaced, as required, with a nozzle conforming to the type of the target electronic component 1 in terms of a size and a shape. A nozzle 9a compatible with an electronic component 1a having a comparatively-small bump size and a nozzle 9b compatible with an electronic component 1b having a comparatively-large bump size are illustrated. The paste transfer unit 10 is positioned in a travel path of the transfer head 7 and has a function of supplying the paste 3 to the bumps 2 of the electronic components 1 attached to the nozzles 9 by suction. The paste transfer unit 10 is built from a squeegee unit 12 having a pair of squeegees 11 positioned in parallel with a predetermined space therebetween and a transfer table 14 having a transfer surface 13 that is formed as an upper surface and that faces lower ends of a pair of squeegees 11. The transfer table 14 is configured so as to be freely, horizontally movable, by the horizontal movement mechanism 15, in the same direction where the pair of squeegees 11 are arranged.

In FIG. 2, the pair of squeegees 11a and 11b provided in the squeegee unit 12 are configured so as to be independently movable in the vertical direction by means of perpendicular movement mechanisms 16a and 16b. The vertical movement mechanisms 16a and 16b are driven and controlled by a control unit 17, to make it possible to arbitrarily set a distance between the lower ends of the respective squeegees 11 and the transfer surface 13. When the transfer table 14 is horizontally moved while the lower end of one squeegee 11a remains in contact with the transfer surface 13 and while the lower end of the other squeegee 11b is upwardly moved from the transfer surface 13 by an arbitrary distance, a paste film 3 whose thickness is equivalent to the height of a squeegee gap "c" formed from clearance between the lower end of the squeegee 11b and the transfer surface 13 is spread over the transfer surface 13. The height of the squeegee gap "c" can be adjusted by bringing the lower end of the squeegee 11a into close contact with or apart from the transfer surface 13, so that the thickness of the paste film 3 to be spread over the transfer surface 13 can be freely set. A correlation exists between the thickness of the paste film 3 and the amount of paste to be transferred to the bumps 2. The bumps 2 immerse themselves in the paste 3 much deeper by making the film thickness large, and the amount of paste to be transferred is increased. The amount of paste to be transferred is reduced by making the film thickness small. In FIG. 1, when the electronic components 1 attached to the nozzle 9 by suction are brought into contact with the transfer surface 13, the bumps 2 immerse themselves into the paste film 3, so that the amount of paste equivalent to the film thickness is transferred to the bumps 2.

In FIG. 2, a storage unit 18 of the control unit 17 stores a database defining a relationship among bump heights, paste types, and squeegee-gap heights. In the electronic component mounting apparatus, varieties of electronic components differing from each other in terms of a bump height become objects to be mounted, and many types of paste are also used as objects to be transferred in connection with paste that is transferred to a bump as an auxiliary connection agent. When the bump height changes, a change arises in clearance between a substrate and a main body of an electronic component during mounting of the electronic component on the substrate. Therefore, in order to assure given connection quality, the amount of paste to be transferred to a bump must be brought in conformance with the bump height. Further, since a characteristic of paste changes from one type to another, the amount of paste to be transferred to a bump must be brought in conformance with a paste type in order to assure given connection quality. For these reasons, optimum film thicknesses of paste are set for respective bump heights H1, H2, H3, . . . and paste types P1, P2, P3, . . . on the basis of theoretical values and experimental values, and a database storing correspondence between the film thicknesses of paste and corresponding squeegee-gap heights G11, G12, G13, . . . is created.

The control unit 17 is equipped with an input unit 19 and a computing unit 20. The input unit 19 functions as input means that inputs the height of bumps on an electronic component to be mounted and the type of paste to be transferred. The computing unit 20 functions as a squeegee-gap height deriving means that derives the height of a squeegee gap in correspondence with an input bump height and an input paste type from the database For instance, provided that an electronic component which is an object of mounting in the electronic component mounting apparatus has a bump height H1 and that an object of transfer is a paste type P2, when a bump height H1 and a paste type P2 are input by way of the input unit 19, the computing unit 20 derives a squeegee gap height G21 in correspondence with the bump height H1 and the paste type P2 from the database stored in the storage unit 18. The vertical movement mechanisms 16a and 16b function as squeegee gap height adjustment means. The lower end of one squeegee 11a is brought into contact with the transfer surface 13, and the lower end of the other squeegee 11b is moved upwardly over a distance equivalent to the squeegee gap height G21 from the transfer surface 13, thereby adjusting the height of the squeegee gap "c" formed from clearance between the lower end of the squeegee 11b and the transfer surface 13 to the squeegee gap height G21. Thereby, the paste film 3 having a film thickness optimum for the height of the bump to be mounted and the type of paste to be transferred can be spread over the transfer surface 13.

Since the squeegee gap "c" can be adjusted to an arbitrary height by actuation of the vertical movement mechanism 16b (see FIG. 2) acting as vertical movement means that relatively moves the squeegee 11b and the transfer surface 13 in the vertical direction, the paste film 3 having a different film thickness can be spread over the transfer surface 13. In FIG. 3A, when the transfer table 14 is horizontally moved in the direction of arrow "a" while the height of the squeegee gap "c" is adjusted to c1, the paste film 3a whose thickness is equivalent to the squeegee gap height c1 is spread over the transfer surface 13, as shown in FIG. 3B. Next, horizontal movement of the transfer table 14 is temporarily stopped as shown in FIG. 3C, and the squeegee 11b is vertical moved in the direction of arrow "b." The height c1 of the squeegee gap is thereby changed to c2. In FIG. 3D, when the transfer table 14 is further horizontally moved in the direction of arrow "a," the paste film 3b whose thickness is equivalent to the height c2 of the squeegee gap is continually spread so as to follow the paste film 3a. As a result of the paste films 3a and 3b having different thicknesses being continually spread over one transfer surface 13, appropriate amounts of paste can be simultaneously transferred to the bumps 2a and 2b of the electronic components 1a and 1b of different types attached to the plurality of nozzles 9a and 9b by suction, as shown in FIG. 1.

Paste films having different thicknesses can also be spread over the transfer surface without relatively moving the squeegee 11b and the transfer surface 13 in the vertical direction. In FIG. 4A, the transfer table whose transfer surface 13 is partitioned into a plurality of surfaces 13a, 13b, and 13c having different heights is used, and a squeegee gap c3 is formed at clearance between the surface 13a partitioned at the highest position and the squeegee 11b. When the transfer table 14 is horizontally moved in the direction of arrow "a" in this state, the paste film 3c whose thickness is equivalent to the height c1 of the squeegee gap is spread over the surface 13a, and paste films 3d and 3e having greater thicknesses are spread over the surfaces 13b and 13c partitioned at lower positions.

Next, an electronic component mounting method of the present embodiment will now be described by reference to FIGS. 1, 2 and along a flowchart shown in FIG. 5. First, the height of a bump of the electronic component 1 to be mounted and the type of paste to be transferred in the electronic component mounting apparatus are input by way of an input unit 19 (ST1). Next, the height of a squeegee gap in correspondence to the input bump height and the paste type is derived on the basis of the database that defines correlation among bump heights, past types, and squeegee-gap heights and that is stored in the storage unit 18 (ST2). A squeegee gap "c" formed from clearance between the squeegee 11b and the transfer surface 13 is adjusted to the derived squeegee gap height (ST3). The squeegee 11b and the transfer surface 13 are relatively moved in a horizontal direction, thereby spreading, over the transfer surface 13, the paste film 3 whose thickness is equivalent to the height of the squeegee gap "c" formed between the squeegee 11b and the transfer surface 13 (ST4) Next, the electronic component 1 attached to the nozzle 9 by suction is brought into contact with the transfer surface 13, and paste is transferred to the bump 2 (ST5). The electronic component 1 is mounted on the substrate 4 such that the bump 2 of the electronic component 1 comes into contact with the pad of the substrate 4 (ST6). Subsequently, there is performed processing for fusing the bump 2 by way of a reflow process.

As mentioned above, according to the electronic component mounting method and the electronic component mounting apparatus of the present invention, correlation among bump heights, paste types, and squeegee-gap heights is defined as a database, and the height of a squeegee gap is automatically derived in response to the height of a bump of an electronic component to be mounted and the type of paste to be transferred. Accordingly, an appropriate, exact amount of paste can be transferred to a bump, so that given connection quality can be assured.

Although the present invention has been described in detail by reference to a specific embodiment, it is obvious for the skilled in the art that various modifications and alterations can be made to the present invention without departing the spirit and scope of the present invention.

The present patent application is based on Japanese Patent Application (JP-A-2006-237245) filed on Sep. 1, 2006 in Japan, contents of which are incorporated herein for reference.

INDUSTRIAL APPLICABILITY

According to the present invention, correlation among bump heights, paste types, and squeegee-gap heights is defined as a database, and the height of a squeegee gap is automatically derived in response to the height of a bump of an electronic component to be mounted and the type of paste to be transferred. Accordingly, an appropriate, exact amount of paste can be transferred to a bump, and there is yielded an advantage of the ability to assure given connection quality. The present invention is useful in the field of electronic component mounting in which an electronic component whose bump has a transferred paste is mounted on a substrate.

The invention claimed is:

1. An electronic component mounting apparatus that mounts on a substrate an electronic component having a bump to which a paste spread over a transfer surface is transferred, the apparatus comprising:

a paste transfer unit that horizontally, relatively moves a squeegee and the transfer surface with respect to each other, thereby spreading, over the transfer surface, a paste film whose thickness is equivalent to a height of a squeegee gap formed from a clearance between the squeegee and the transfer surface;

a database of optimum squeegee-gap heights set for respective bump heights and paste types;

a storage unit that stores the database;

a squeegee-gap height deriving unit that derives, from the database, a squeegee-gap height in correspondence with a height of the bump of the electronic component to be mounted and a type of the paste to be transferred; and a squeegee-gap height adjustment unit that adjusts the height of the squeegee gap formed from the clearance between the squeegee and the transfer surface to the derived squeegee-gap height.

2. The electronic component mounting apparatus according to claim 1, further comprising a vertical movement unit that vertically moves the squeegee and the transfer surface with respect to each other.

3. The electronic component mounting apparatus according to claim 1, wherein the transfer surface is partitioned into a plurality of surfaces of different heights.

4. An electronic component mounting method for mounting on a substrate an electronic component having a bump to which a paste spread over a transfer surface is transferred by the squeegee, the method comprising:

a step of deriving a squeegee-gap height in correspondence with a height of the bump of the electronic component to be mounted and a type of the paste to be transferred from a database of optimum squeegee-gap heights set for respective bump heights and paste types;

a step of adjusting to the derived squeegee-gap height a squeegee gap formed from the clearance between the squeegee and the transfer surface;

a step of spreading paste, over the transfer surface, to a thickness equivalent to a height of the squeegee gap formed from the clearance between the squeegee and the transfer surface by means of horizontally, relatively moving the squeegee and the transfer surface with respect to each other; and a step of transferring the paste spread over the transfer surface to the bump and mounting the electronic component to the substrate.

\* \* \* \* \*